US010617045B1

(12) United States Patent
Judy

(10) Patent No.: US 10,617,045 B1
(45) Date of Patent: Apr. 7, 2020

(54) CONDUCTIVE GLOVE COUPLING ASSEMBLY FOR SHIELDED ENCLOSURES

(71) Applicant: Merakai, LLC, Santa Barbara, CA (US)

(72) Inventor: Ryan Judy, Santa Barbara, CA (US)

(73) Assignee: Merakai, LLC, Santa Barbara, CA (US)

( * ) Notice: Subject to any disclaimer, the term of this patent is extended or adjusted under 35 U.S.C. 154(b) by 0 days.

(21) Appl. No.: 16/190,069

(22) Filed: Nov. 13, 2018

(51) Int. Cl.
*G21F 7/04* (2006.01)
*G21F 7/053* (2006.01)
*H05K 9/00* (2006.01)

(52) U.S. Cl.
CPC ............ *H05K 9/0069* (2013.01); *G21F 7/04* (2013.01); *G21F 7/053* (2013.01); *H05K 9/0015* (2013.01)

(58) Field of Classification Search
CPC combination set(s) only.
See application file for complete search history.

(56) References Cited

U.S. PATENT DOCUMENTS

| 3,051,163 A * | 8/1962 | Trexler | B25J 21/02 312/1 |
| 5,299,243 A * | 3/1994 | Picco | G21F 7/053 376/287 |
| 2011/0232956 A1 * | 9/2011 | Ramsey | H05K 9/0069 174/382 |

\* cited by examiner

Primary Examiner — Nicole M Ippolito
Assistant Examiner — Sean M Luck
(74) Attorney, Agent, or Firm — Lance M. Pritkin

(57) ABSTRACT

A glove assembly is provided for coupling an electrically-conductive glove to an enclosure wall of a radio frequency shielded enclosure. Exemplary embodiments of the glove assembly and associated shielded enclosure comprise a glove interface element, a glove and a glove securement element. The glove interface element has a cylindrical flange member, a wall securement portion extending laterally of the flange member, and a glove port extending through the flange member. The glove interface element is configured to be affixed to the enclosure wall. The glove securement element is configured to clampingly secure an open end of the glove to the flange member in mutual RF-signal-sealed engagement. Resultingly, the glove is also held in electrically-conductive communication with the shielding layer of the shielded enclosure by way of the glove interface element. The glove securement element is preferably actuatable to enable a user to selectively cause and release the clamped securement.

26 Claims, 9 Drawing Sheets

CONDUCTIVE GLOVE COUPLING ASSEMBLY FOR SHIELDED ENCLOSURES

RELATED APPLICATIONS

None.

TECHNICAL FIELD

The present disclosure relates generally to the field of electromagnetic shielding enclosures. More particularly, the present disclosure relates to conductive gloves and their method of integration into RF-shielded enclosures.

BACKGROUND

Radio frequency shielded enclosures are used for many purposes, most typically wireless device testing, data security, and forensics investigations. Many types of RF enclosure products exist in the conventional art, the majority of which fall under two product-descriptive categories, hard and soft. RF enclosures in each of these categories have remained relatively consistent, using many of the same types of materials, construction techniques, and even intended purposes. For example, soft enclosures such as faraday bags are conventionally made with fabrics, threads, binding, webbing, hook and loop, and other such materials utilized in the textile industry. These types of RF enclosures may be used for forensic evidence transport, but are very seldom used for forensic evidence lab analysis, which typically requires larger, dimensional, ergonomic enclosures with features suited to the task of analysis. Some of these features required for analysis may be conductive gloves to operate devices, RF filters for passing data and power in and out of the enclosure, power strips to power devices inside of the enclosure, lights, and RF shielded windows to see devices inside and photograph their screens. Some of these features may become damaged over time and require replacement, such as conductive gloves which experience abrasion after heavy usage, resulting in shielding loss and failure of the enclosure. For these reasons, lab forensic analysis or wireless testing has conventionally occurred using hard metal enclosures with replaceable conductive gloves, RF filters mounted through the sides, shielded windows, power strips, and lights.

Although the aforementioned categories of RF enclosures have served their intended purposes in the past, new usage scenarios that cross the lines of conventional usage require enclosures that do the same. For example, forensic examiners may now require RF shielded evidence under examination to stay shielded while new evidence is introduced into the same enclosure. This feature, on majority, has only been available in soft enclosures like faraday tents, but could be applied to desktop-sized enclosures with semi-soft walls. Another example of the requirement for crossing soft and hard RF enclosures relates to the need for portability. Users of lab-style enclosures may need to perform forensic analysis or wireless testing in other environments, and therefore require portable RF enclosures with lab capability. Hard enclosures may be too heavy, bulky, and inconvenient to meet this demand for portability. RF enclosures have seldom satisfied these "mixed requirements" for the reasons mentioned earlier, which have been difficult or impossible to accomplish using the materials and techniques currently available in the market and represented in the prior art.

What is needed is a solution to one of the primary obstacles encountered when mixing hard and soft enclosures. Conductive gloves/hand pockets are a core element of shielded enclosures for forensic analysis, wireless testing, and other similar uses. They are the standard means for allowing devices to be operated and manipulated inside of enclosures. For soft-sided shielded enclosures, the gloves/hand pockets have conventionally been sewn directly into the conductive shielding fabric on the walls of the enclosure, a process with very little or no alternatives. This method of construction may be tedious and expensive to manufacture due to the required precision when sewing and sealing the seams. Furthermore, it can be highly problematic for users. Wear and tear can eventually cause the gloves to lose conductivity and leak signal, rendering the entire enclosure worthless. Without the ability to replace the gloves/hand pockets, the user may be forced to dispose of the entire enclosure or send it to the manufacturer for repair. Both options can represent a significant financial and time loss, especially for users such as military who may be located in foreign countries with no practical ability to send or receive goods, nor the time to spare. Furthermore, some soft-sided enclosures may not even be repairable. Even if the user could send the entire enclosure back for repair, it may be impossible without heavy damage to the product.

Conventional hard-sided shielded enclosures with replaceable gloves may use a means of attaching the gloves to the walls of the enclosure that requires unimpeded access to the main shielding cavity. This means of attachment is the same location where the user may replace the damaged conductive gloves with new ones. Some soft or semisoft-sided enclosures, however, may have shielded main cavities (where the conductive gloves are located) that are difficult to access from the outside. For this reason, a new means of attaching conductive gloves to the main shielded enclosure, that provides access to the connection point from the outside of the enclosure (serviceable from the outside), must be achieved.

In summary, what is needed is a method of connecting conductive gloves/hand pockets to soft-sided or semi-soft-sided shielded enclosures, that is cost-effective and less tedious to manufacture, serviceable from the outside of the enclosure, and facilitates rapid glove replacement by the user.

SUMMARY

Certain deficiencies of the prior art may be overcome by the provision of one or more embodiments of a glove assembly and associated shield enclosure in accordance with the present disclosure. Preferred embodiments of the glove assembly allow for cost-effective and simple coupling of conductive gloves to soft-sided shielded enclosures, as well for immediate "field-ready" replacement of damaged conductive gloves by the user, all being serviceable from the outside of the enclosure (not requiring unimpeded access to the inside of the main shielding cavity). Preferred embodiments of the glove assembly and associated enclosure may comprise a set of metal parts that secure the coupling assembly to the walls of the enclosure, that connect the glove assembly to the shielding layer (e.g., electrically conductive fabric) of the enclosure in such a way that electrical conductivity is maintained, and that allow for the connection and replacement of conductive gloves. Particular preferred embodiments of the glove assembly and associated shielded enclosure may allow the conductive glove to connect to the outside of the shielded enclosure for easy replacement.

BRIEF DESCRIPTION OF THE DRAWINGS

Further advantages of the present invention may become apparent to those skilled in the art with the benefit of the following detailed description of the preferred embodiments and upon reference to the accompanying drawings in which.

DETAILED DESCRIPTION OF THE PREFERRED EMBODIMENTS

Figure 1:
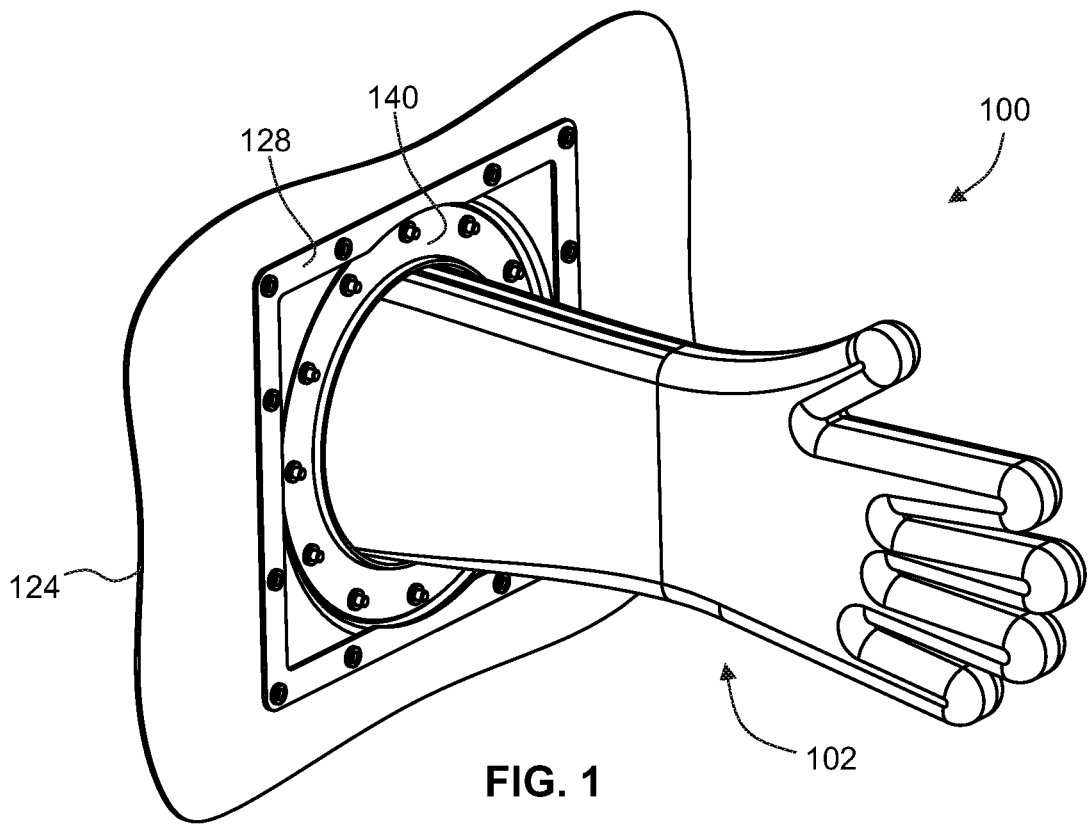
FIG. 1 is a diagrammatic perspective view of one example embodiment of a glove assembly in accordance with the present disclosure.

Referring now to the drawings, like reference numerals designate identical or corresponding features throughout the several views.

Features of particular preferred embodiments of a conductive glove coupling assembly and the overall shielded enclosure in accordance with the present disclosure are disclosed herein. However, alternate embodiments of the glove assembly and shielding enclosure may be constructed with fewer or more features and components than those shown and described in connection with the illustrated embodiments.

Figure 5:
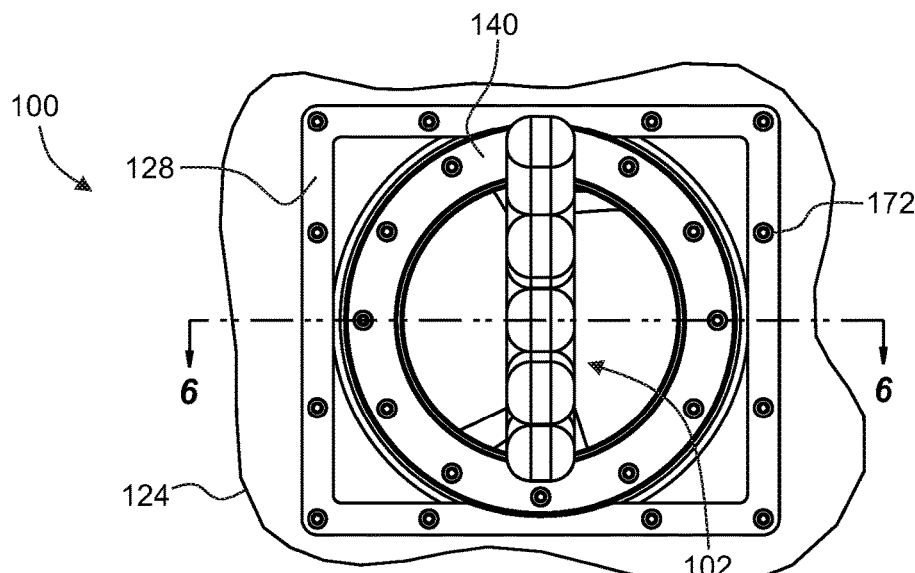
FIG. 5 is a diagrammatic front view of the glove assembly embodiment shown in FIG. 1.
Figure 6:
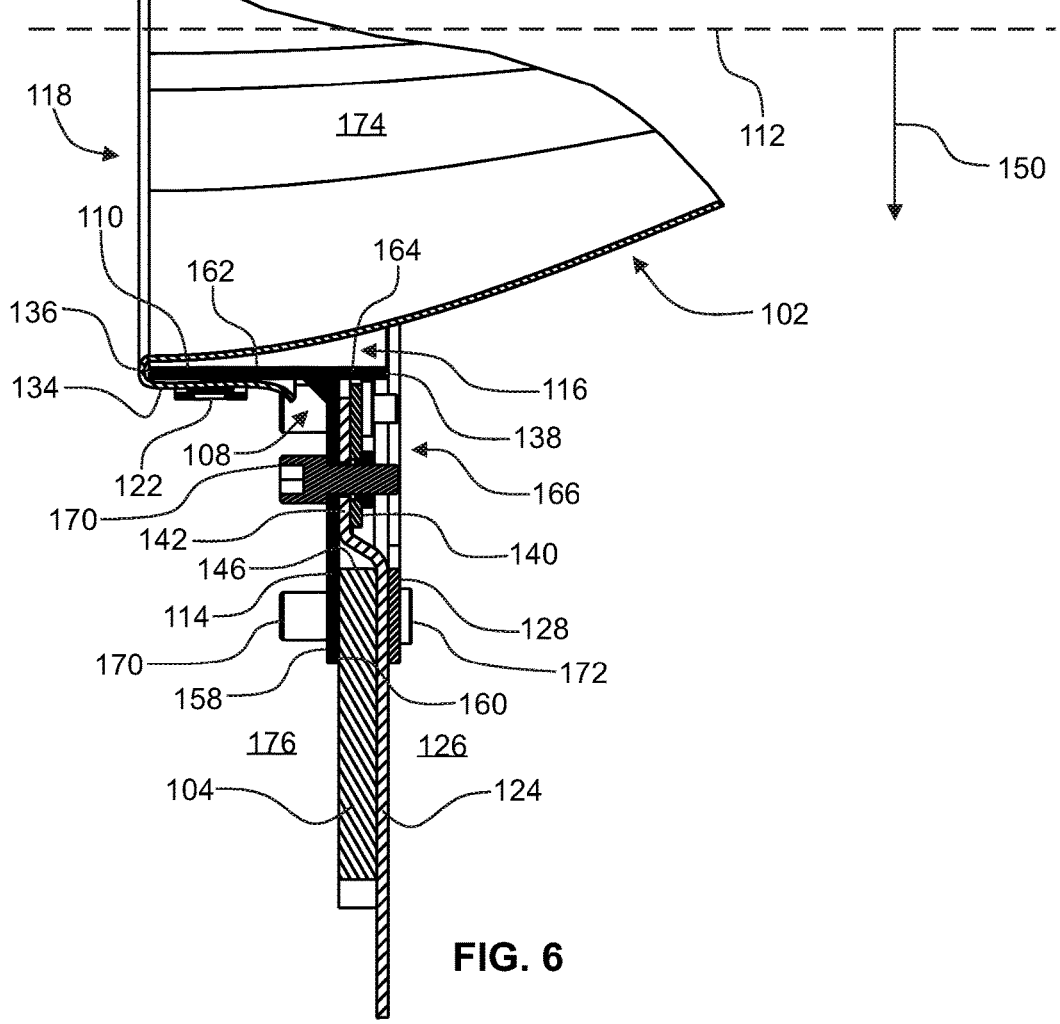
FIG. 6 is a diagrammatic partial cross-sectional view taken along lines 6-6 in FIG. 5.

Example embodiments of a glove assembly for coupling an electrically-conductive glove through an enclosure wall of a radio frequency shielded enclosure are shown generally at 100. Referring to FIGS. 1, 5 and 6, a glove assembly 100 may comprise a glove interface element 108, a glove element 102 and a glove securement element 122.

Figure 7:
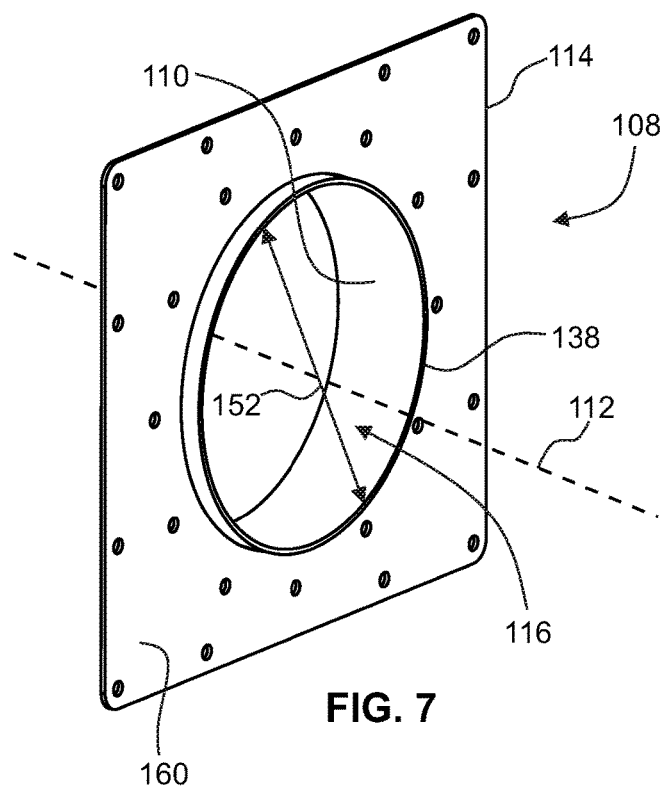
FIG. 7 is a diagrammatic perspective view of an example glove interface element.
Figure 8:
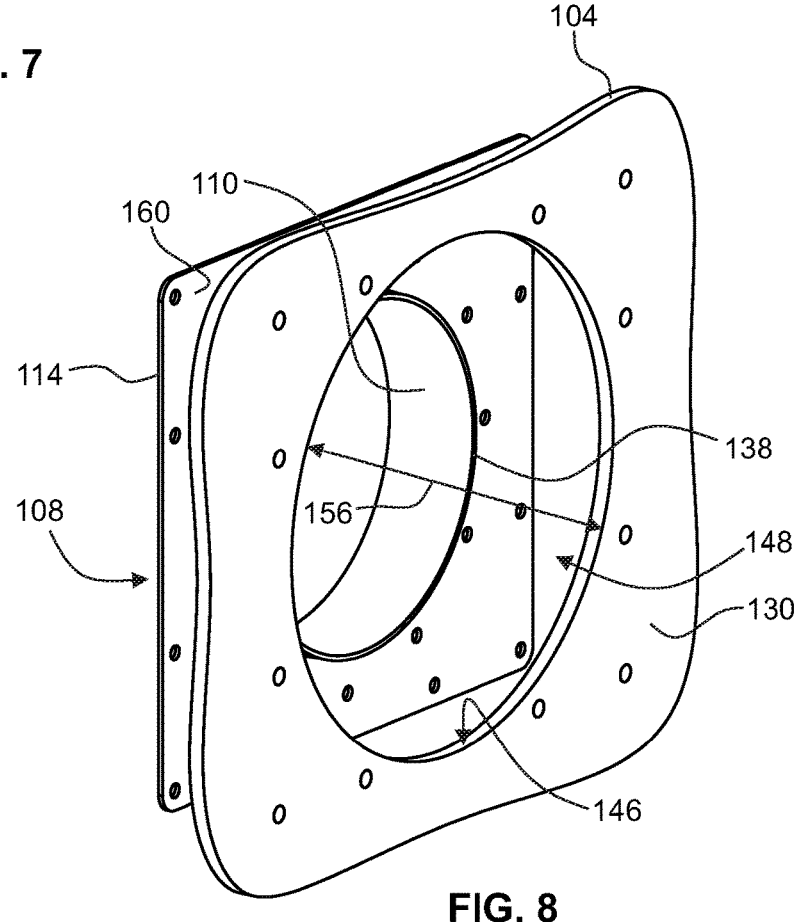
FIG. 8 is a diagrammatic perspective view showing an example glove interface element being placed into engagement with an example enclosure wall.

Referring to FIGS. 6 and 7, the glove interface element 108 may have a cylindrical flange member 110 extending along a port axis 112, a wall securement portion 114 extending laterally of the port axis 112, and a glove port 116 extending through the cylindrical flange member 110 along the port axis 112. Referring to FIGS. 6 and 8, the glove interface element 108 may be configured to be in affixed engagement with the enclosure wall 104.

Figure 2:
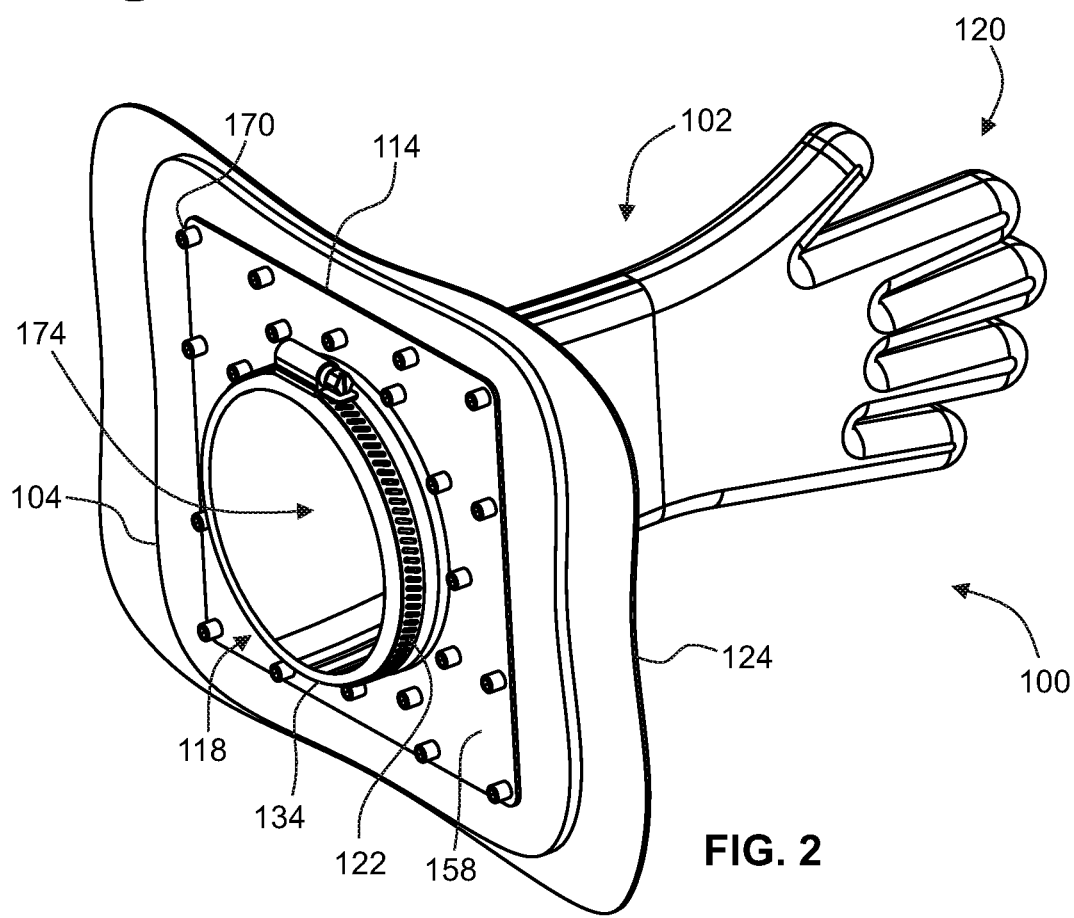
FIG. 2 is a further diagrammatic perspective view of the glove assembly embodiment shown in FIG. 1.
Figure 3:
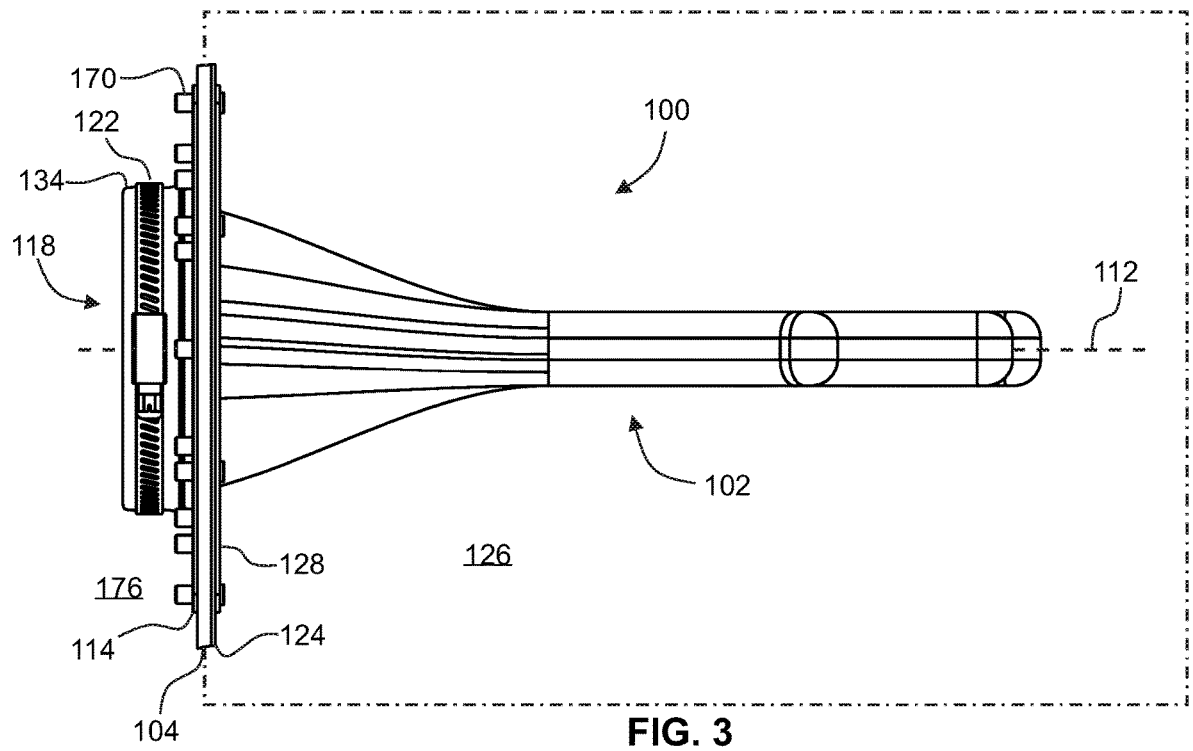
FIG. 3 is a diagrammatic top view of the glove assembly embodiment shown in FIG. 1.

Referring to FIG. 2, the glove element 102 may comprise electrically-conductive (e.g., RF-shielding) material and may have an open end 118 and a closed end 120.

Referring to FIGS. 2-4 and 6, the glove securement element 122 may be configured to clampingly secure the open end 118 and the cylindrical flange member 110 in RF-signal-sealed engagement with one another. In certain preferred embodiments of a glove assembly 100, when the glove interface element 108 is in the affixed engagement with the enclosure wall 104 and the open end 118 is in the clamping securement with the cylindrical flange member 110, the glove element 102 is in electrically-conductive communication with the shielded enclosure 106 by way of the glove interface element 108.

In particular preferred embodiments of a glove assembly 100, the glove securement element 122 is actuatable to enable a user to selectively cause and release the clamped securement. For example, the glove securement element 122 may be actuatable to enable a user to selectively cause and release the clamped securement. To this end, the glove securement element 122 may include an actuatable component such as a threaded element engageable by a torqueing tool (e.g., screwdriver), a cam lock element, a toggle latch, a combination thereof or the like.

In particular embodiments of the glove assembly 100, the enclosure wall 104 may itself be comprised of electrically-conductive material. In such cases, the affixed engagement of the glove interface element 108 to the enclosure wall 104 may be sufficient to place the glove interface element 108 in electrically-conductive communication with the enclosure wall 104.

Referring to FIGS. 2 and 6, in certain preferred embodiments of the glove assembly 100 and shielded enclosure 106, the enclosure wall may be comprised of, for example, a rigid polymer or the like having little to no electrical conductivity. In such embodiments, the shielded enclosure 106 may include a shielding layer 124 disposed between the enclosure wall 104 and a main cavity 126 of the shielded enclosure 106. Moreover, the glove interface element 108 may be configured to be in electrically-conductive communication with the shielding layer 124 when the glove interface element 108 and enclosure wall 104 are in the affixed engagement with one another.

Figure 11:
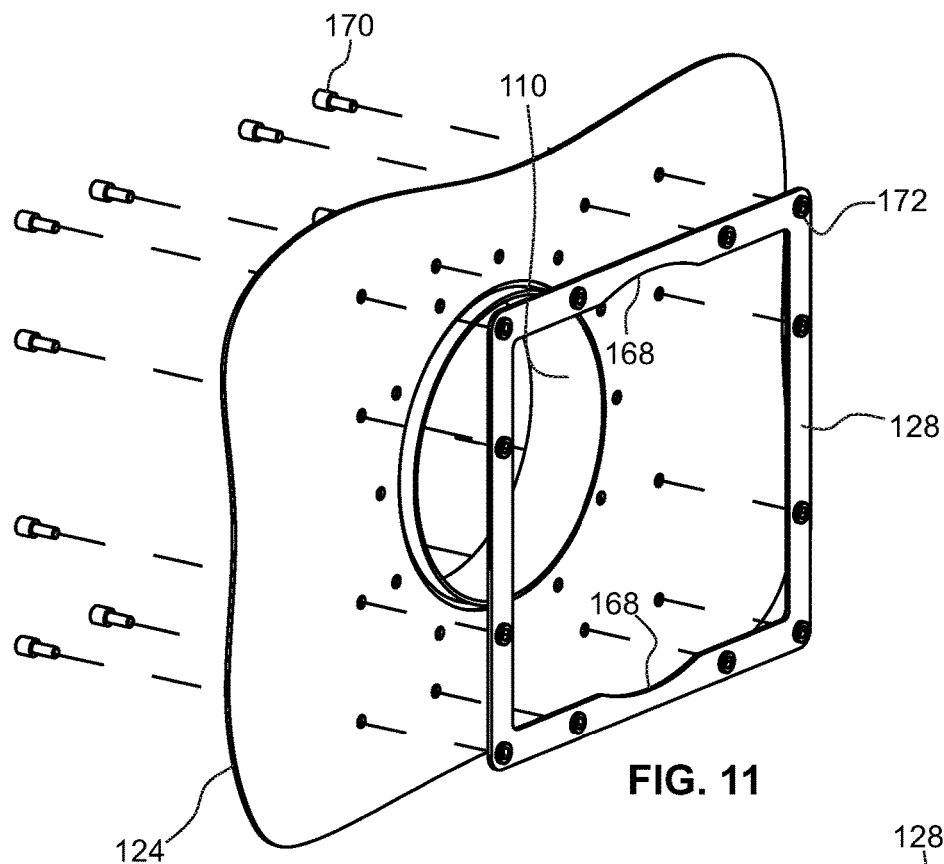
FIG. 11 is a diagrammatic perspective view showing how a combined shielding layer and enclosure wall may be secured between a primary backing element and a wall securement portion of a glove interface element by way of fasteners.

Referring to FIGS. 5, 6 and 11, particular preferred embodiments of the glove assembly 100 and shielded enclosure 106 may further comprise a primary backing element 128. In such embodiments, the affixed engagement of the glove interface element 108 to the enclosure wall 104 may be by way of fastening a portion of the enclosure wall between the wall securement portion 114 and the primary backing element 128.

Referring to FIGS. 6 and 7, in certain embodiments of the glove assembly 100 and shielded enclosure 106, the wall securement portion 114 includes opposing faces 158 and 160, and the cylindrical flange member 110 extends outward from each opposing face.

Referring to FIGS. 4, 6, 13 and 16, in particular embodiments of the glove assembly 100 and shielded enclosure 106, the glove element 102 extends through the cylindrical flange member 110 and into a main cavity 126 of the shielded enclosure 106. Referring to FIGS. 2, 4, 6 and 15, in such embodiments, the open end 118 of the glove element 102 may extend outward of the cylindrical flange member 110 and fold over an outboard end 136 of the cylindrical flange member 110.

Figure 4:
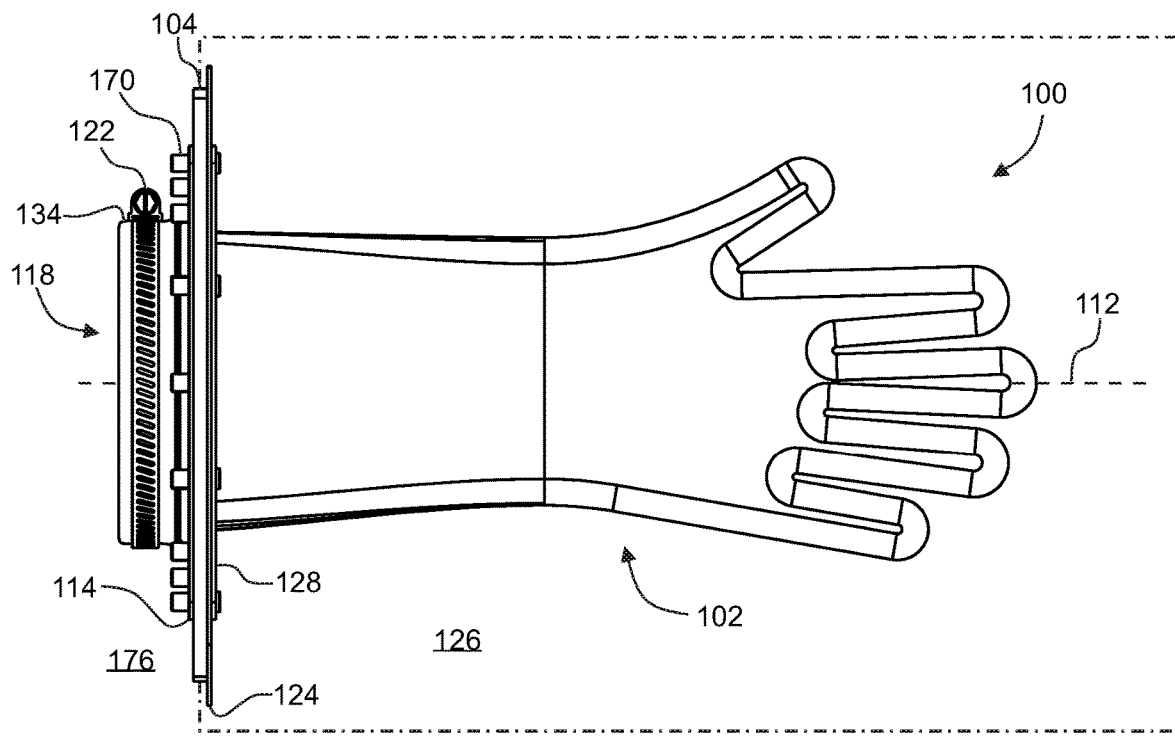
FIG. 4 is a diagrammatic side view of the glove assembly embodiment shown in FIG. 1.

Referring to FIGS. 4 and 6, in certain embodiments of the glove assembly 100 and shielded enclosure 106, the shielded enclosure 106 includes a shielding layer 124 disposed between the enclosure wall 104 and a main cavity 126 of the shielded enclosure 106. In such embodiments, the glove interface element 108 is in electrically-conductive communication with the shielding layer 124.

Figure 9:
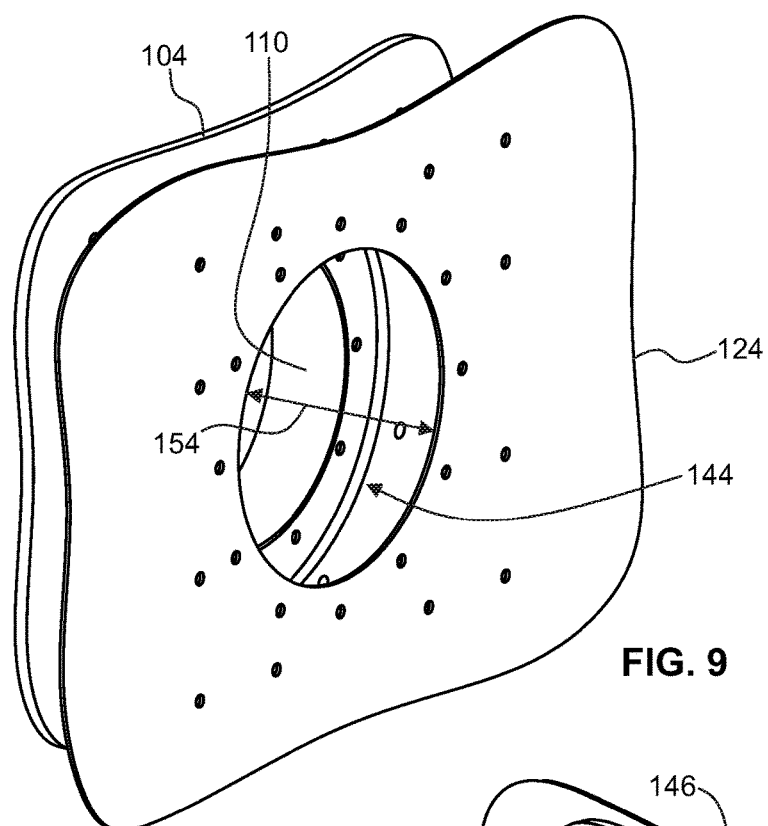
FIG. 9 is a diagrammatic perspective view showing an example shielding layer being brought into engagement with the previously-engaged enclosure wall and shielding layer.
Figure 10:
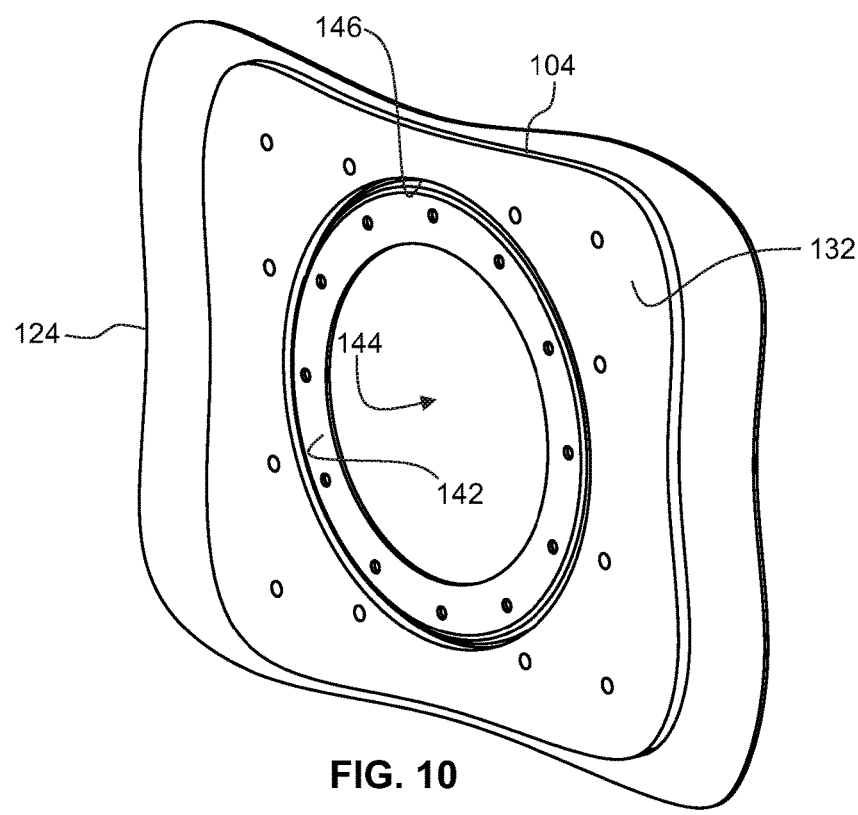
FIG. 10 is a diagrammatic perspective view showing how a shielding periphery portion of a shielding layer may be recessed into the wall aperture defined by the wall aperture lip.

Referring to FIGS. 1 and 6, particular embodiments of the glove assembly 100 and shielded enclosure 106 may further comprise a primary backing element 128 and a secondary backing element 140. Referring to FIGS. 6, 9 and 10, the shielding layer 124 may include a shielding periphery portion 142 defined about a shielding aperture 144. Referring to FIGS. 6, 8 and 10, the enclosure wall 104 may include a wall aperture lip 146 defined about a wall aperture 148. The glove port 116, wall aperture 148 and shielding aperture 144 are preferably in alignment with one another along the port axis 112. Referring to FIG. 6, t section of the enclosure wall 104 may be fastened between the wall securement portion 114 and the primary backing element 128, thereby facilitating the affixed engagement between the glove interface element 108 and the enclosure wall 104. Radially inward of the wall aperture lip 146 (a radially outward direction is shown at 150), the shielding periphery portion may preferably be fastened between the secondary backing element 140 and the wall securement portion 114, thereby maintaining the shielding periphery portion 142 in electrically-conductive communication with the glove interface element 108. Moreover, referring again to FIG. 6, the shielding layer 124 may be partially disposed between the enclosure wall 104 and the primary backing element 128.

Referring to FIGS. 7-9, in certain preferred embodiments of the glove assembly 100 and shielded enclosure 106, the glove port 116 has a port diameter 152, the shielding aperture 144 has a shielding aperture diameter 154, and the wall aperture 104 has a wall aperture diameter 156 greater than each of the port diameter 152 and the shielding aperture diameter 154.

Referring to FIGS. 6 and 7, in certain preferred embodiments of the glove assembly 100 and shielded enclosure 106, the wall securement portion has an obverse face 158 and a reverse face 160. The cylindrical flange member 110 may have a first segment 162 extending outward of the obverse face 158, and a second segment 164 extending outward of the reverse face 160. An annular conduction channel 166 may be defined between the wall aperture lip 146, the second segment 164 and the wall securement portion 114. The shielding periphery portion 142 may be disposed within the annular conduction channel 166. Referring to FIG. 6, in such embodiments, the secondary backing element 140 may also be disposed within the annular conduction channel 166.

Referring to FIG. 5, the secondary backing element 140 may preferably be annular (e.g., circular, elliptical, etc.). In particular embodiments, the primary backing element 128 may be, for example, rectangular. Moreover, as illustrated for example in FIGS. 5, 11 and 12, the primary backing element 128 may include one or more clearance reliefs 168 configured to facilitate passing of the secondary backing element 140 through the center of the primary backing element 128. In certain embodiments, the primary and secondary backing elements may be unitarily formed as a single component.

Figure 12:
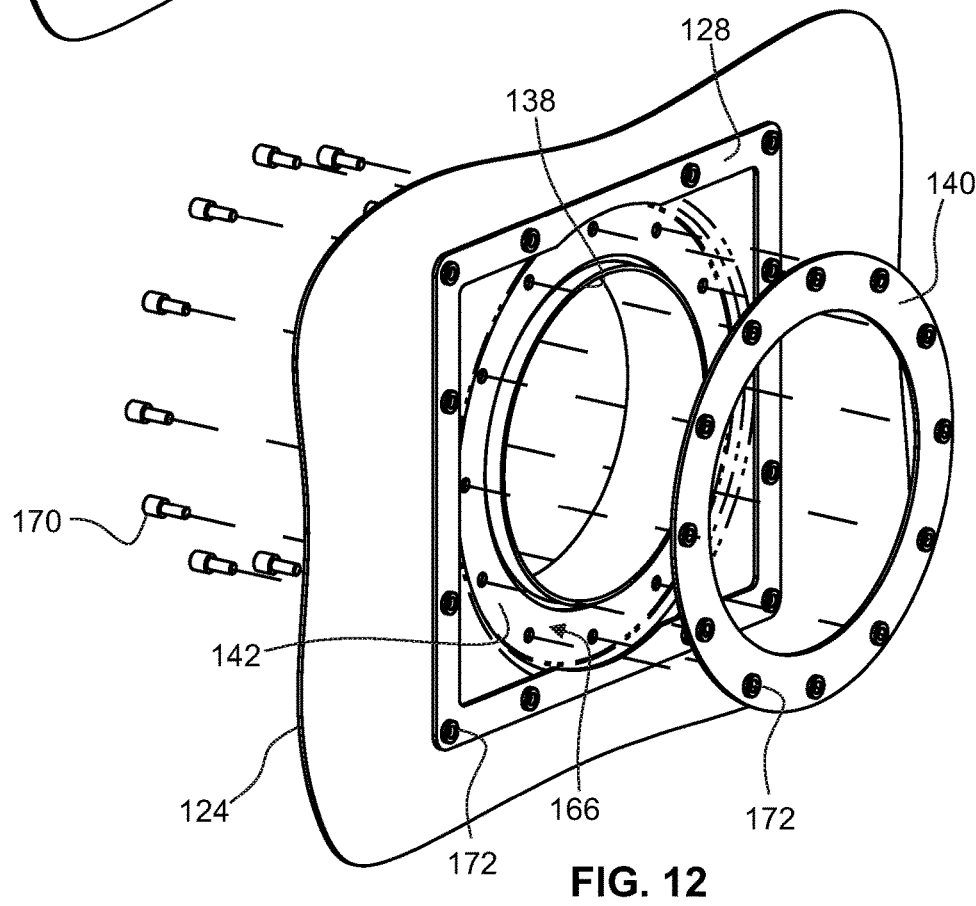
FIG. 12 is a diagrammatic perspective view showing how a shielding periphery portion of a shielding layer may be secured between a secondary backing element and a wall securement portion of glove interface element by way of fasteners.

Referring to FIGS. 6, 11 and 12, the primary backing element 128 and/or secondary backing element 140 may be secured to the wall securement portion 114 by way of, for example, a respective plurality of fastener elements 170. These fastener elements 170 may preferably be threaded, and may threadedly engage corresponding threaded receiving elements 172 such as swage (self-clinching) nuts or PEM nuts affixed to the respective backing element. In particular embodiments, some or all of the faster elements 170 may be rivets (e.g., blind/pop rivets, solid rivets) or the like.

Referring to FIGS. 3-6 and 14, embodiments of a radio frequency shielded enclosure 106 with an electrically-conductive glove assembly 100 may comprise an enclosure wall 104, a shielding layer 124, a glove interface element 108, a glove element 102 and a glove securement element 122. The enclosure wall 104 may at least partially define a main cavity 126 within the shielded enclosure 106. A shielding layer 124 may be disposed between the enclosure wall 104 and the main cavity 126. The glove interface element 108 may have a cylindrical flange member 110 extending along a port axis 112, a wall securement portion 114 extending laterally of the port axis 112, and a glove port 116 extending through the cylindrical flange member 110 along the port axis 112. The glove interface element 108 may be in affixed engagement with the enclosure wall 104 and may be in electrically-conductive communication with the shielding layer 124. The glove element 102 may comprise electrically-conductive material and have an open end 118 and a closed end 120. The glove element 102 may extend through the cylindrical flange member 110 and into the main cavity 126. The open end 118 may preferably extend outward of the cylindrical flange member 110 and fold over an outboard end 136 of the cylindrical flange member 110. A glove securement element 122 may be provided to clampingly secure the open end 118 and the cylindrical flange member 110 in RF-signal-sealed engagement with one another. The glove element 102 is preferably in electrically-conductive communication with the shielded enclosure 106 by way of the glove interface element 108. The glove securement element 122 is preferably actuatable to enable a user to selectively cause and release the clamped securement.

Material and Finish

Preferred embodiments of the glove coupling assembly 100 may include three primary metal components. These components may be made of a conductive metal such as aluminum, ideally 5052 aluminum, and treated on the surface with a treatment such as clear chem film finish to avoid corrosion.

In other embodiments the components may be made of copper, stainless steel, nickel, or any other conductive material, or even non-conductive material if conductivity is achieved through other means than expressed herein. In other embodiments, two, four, or any other number of components may be used as well; it is not necessary to use only three components if another number of components may provide the utility expressed herein. Finally, in other embodiments another type of finish may be used, or no finish at all—the material may be left raw.

Details Regarding Certain Embodiments of the Glove Interface Element

In certain preferred embodiments, the wall securement portion 114 (which may otherwise be referred to herein as a "front panel") of the glove interface element 108 may include a flat surface (e.g., planar portion) which may be designed to mount to the outside of a soft or semi-soft-sided shielded enclosure, or in other embodiments, any other type of enclosure. The flat surface may include a hole in the middle, where a cylindrical flange member 110 (which may otherwise be referred to herein as a "tube") may be perpendicularly welded to the flat surface. Part of the tube may protrude through both sides of the flat surface, one side facing the user of the glove assembly (front), the other side facing the inside of the shielded enclosure (back). The part of the tube protruding towards the front may be used as a surface to mount conductive gloves, by means of a hose clamp or other object that conductively secures a conductive glove to the tube. Hard-sided shielded enclosures may use the side of the tube facing the back as the area for mounting a conductive glove, but access to this part may require unimpeded access to the main cavity of the shielded enclosure—an aspect that may be unavailable in various soft or semi-soft-sided shielded enclosures. In important part, the present disclosure provides a glove assembly enabling a front-mounted (e.g., externally-mounted) glove in a shielded enclosure.

In alternate embodiments, the front panel may not necessarily be flat, but may include surface features that are non-flat (non-planar), or may be non-flat in entirety. The front panel may not even be a panel, but may be integrated into the shielded enclosure, or perhaps not necessarily integrated but simply not "panel-like." The front panel may be connected to a tube via other means than welding, or may not necessarily be connected to a tube. The front panel may instead be connected directly to conductive gloves, may use a gasket of some sort, or even a clamp-style connection. If a tube is present in other embodiments, it may not necessarily protrude from the front panel in the same way as described and depicted elsewhere herein, but instead may remain flat against the front or back, or may protrude in a slightly different way or a different angle than perpendicular. In alternate embodiments, conductive gloves or hand pockets (which may be otherwise referred to herein as "glove elements") may in fact be connected to the tube or other structure on the inside portion of the material, as it may not be necessary to connect on the outside. In the preferred embodiments a hose clamp (e.g., as shown at 122) can be used to connect the conductive gloves to the tube. However, in alternate embodiments, any other connection method may be used, whether the gloves are connected to the tube itself or directly to the front panel. For example, a circular flat "clamshell" connection may be used that could clamp the gloves into place, or even an elastic ring may be used as the glove securement element 122.

Details Regarding Certain Embodiments of the Enclosure Wall

In certain preferred embodiments, the glove assembly 100 may be connected to a wall of a soft or semi-soft shielded enclosure 106. To understand the usefulness of the glove assembly, it may be important to describe the walls of a shielded enclosure and how the glove assembly may attach to it. An example of a semi-soft shielded enclosure could include an outer layer of a protective material such as ballistic nylon (not shown), which is then followed by a material that provides structure and stability, such as a rigid plastic (e.g., enclosure wall 104), which may then be followed by a conductive material such as shielding fabric (e.g., shielding layer 124). The shielding fabric may form the inner portion of the shielded enclosure, and therefore may need to be connected directly to the glove assembly. A challenge arises when attempting to secure the glove assembly to the wall of the enclosure, but also to connect the shielding fabric directly to the assembly, allowing electrical conductivity to be maintained between the glove, the glove interface element, and the shielding fabric. The present disclosure may overcome this challenge with an approach that simultaneously facilitates the connection of the glove interface element to the shielding fabric and the connection of the glove interface element to the wall of the enclosure. The approach may include providing a hole in the wall of the shielded enclosure that can be of a desired size, allowing the shielding fabric to pass through the hole and connect directly to the glove interface element. The shielding fabric may have a hole that is smaller than the hole in the wall of the shielded enclosure, such that a certain portion of shielding fabric may be exposed to the front panel, and may therefore connect directly to its surface. The hole in the shielding fabric may nearly match the size of the tube, so that the inner portion of the tube may protrude into the main cavity of the shielding enclosure.

In alternate embodiments, the glove interface element may be connected to a shielded enclosure wall composed of entirely different materials than those described with specificity herein. In certain alternate embodiments of the glove assembly and shielded enclosure, the separate steps of attaching the glove interface element to the enclosure wall and attaching the glove interface element to the shielded fabric may not be necessary. For example, a similar result may be achieved with a solid panel formed to the appropriate shape, to allow attachment of the glove interface element to the enclosure wall and shielded fabric simultaneously. Similarly, attachment to the outer wall of the enclosure may not even be necessary, and attachment simply to a layer or multiple layers of conductive material may suffice. For example, the aluminum wall of an aluminum shielding enclosure may serve EMI shielding and rigidity functions, such that separate layers (e.g., distinction between the enclosure wall and shielding layer) are not required. Connection of the glove assembly to this type of wall may be considered as an alternate embodiment of presently-disclosed expedients, and could cause the glove assembly to only require a single backing ring, plate, or other means of securing the glove assembly to the wall. Additionally, in alternate embodiments the hole that is formed in the wall of the enclosure may not need to be larger than the hole in the shielding material, may be smaller, or may not even exist. The hole that is formed in the shielding fabric may not need to be smaller than the hole in the shielding material, may be larger, or may not even exist. Finally, in alternate embodiments, the inner portion of the tube may not necessarily protrude into the main cavity of the shielding enclosure, but may instead be flush with the enclosure wall or non-existent.

Details Regarding Integration of the Glove Assembly with the Enclosure

With reference to FIGS. 7-13, in certain preferred embodiments, the front panel may be secured to the wall 104 of the enclosure 106 by means of a rectangular backing ring (e.g., primary backing element 128) while the shielding fabric 124 may be secured and conductively connected to the front panel by means of a round backing ring (e.g., secondary backing ring 140). Threaded fasteners 170 (e.g., Allen bolts) may be used to securely connect the front panel to the rectangular backing ring as well as to the round backing ring. When connected in the order previously described, the glove assembly may be first attached and secured to the wall of the enclosure, and then the shielding fabric may be secured afterwards. This separation of attachments may allow for an easier, cheaper, and more repeatable manufacturing process, while at the same time offering a lower rate of shielded enclosure failure after manufacturing completion. To one skilled in the art, it may be known that manufacturing shielded enclosures can be tedious and fraught with error, due to the fact that all components must work together as a system to effectively shield EMI, and one "broken link in the chain" may affect the performance of the entire enclosure. It may therefore be important to separate functions of the enclosure from one another to allow for a lower EMI shielding failure rate due to manufacturer error. The inventive expedients disclosed herein not only may offer an improved shielding connection between conductive gloves and shielded enclosures, but may also separate the glove connection process from the textile manufacturing process—thereby leaving the textile manufacturing portion to the textile expert, and the EMI-related assembly portion to a different expert, who may tweak and perfect each individual glove assembly installation as needed. Conventionally, the glove attachment portion of the manufacturing may typically be combined with the rest of the enclosure, leaving little to no room for adjustment, repair, or glove replacement, subsequently wasting the entire shielded enclosure should a failure in the shielded glove portion occur.

In alternate embodiments, the rectangular backing ring may not be rectangular but instead another shape, or may not even exist. Similarly, the round backing ring may not be round but instead another shape, or may not even exist. Either ring may not be a ring (annular) shape, but instead another shape like a block, strip, panel, etc. Allen nuts are shown as the method to connect the components of the assembly together in a preferred embodiment, but may not be required in alternate embodiments. For example, the components may "clamp" together using push nuts, or may connect magnetically, or by means of any other method.

Details Regarding Holes in the Enclosure Wall and Shielding Layer

Depending upon the particular embodiment, the material and construction of the enclosure wall 104 and shielding layer 124 may vary from that which is specifically depicted in the present disclosure. For example, the various figures herein show the enclosure wall as one layer of thick material (e.g., plastic) and the shielding layer 124 as a thinner material (e.g., conductive fabric). FIGS. 8-12 demonstrate the potential sizes of holes which could be cut into each layer to facilitate proper installation of the glove assembly 100. A larger circle could be cut into the plastic wall material 104 while a smaller circle, just slightly larger than the tube 110, could be cut into the conductive fabric 124. The size of the hole cut into the plastic layer could be large enough to allow the conductive fabric to come through the plastic wall and connect directly with the front panel 114. The hole cut into the plastic would not be so large that it overcomes the holes used for the Allen screws that secure the front panel to the rectangular backing ring. In this way, the wall and the fabric may be clamped in between the rectangular backing ring and the front panel, effectively securing the glove assembly to the structural elements of the shielded enclosure wall. After the glove assembly is secured to the structural elements of the shielded enclosure, it may become much easier to secure the conductive part of the shielded enclosure (e.g., the fabric) to the glove assembly. The fabric can pass through the wall layer and become sandwiched in between the round backing ring and the front panel, with no plastic or other wall materials between it. Direct contact of the front panel to the conductive fabric may allow conductivity to occur between the glove assembly and the shielding layer(s) of the enclosure, thereby permitting it to become part of the shielding function of the enclosure.

In certain preferred embodiments, the sizing of the holes in the wall of the enclosure may be unique to the teaching in this disclosure, and work together with the components to secure the glove assembly to the enclosure while simultaneously allowing conductivity. To one experienced in the art of designing EMI enclosures, these holes would not be obvious, and would in fact be counterintuitive, as holes can be the primary cause of shielding enclosure failure. In fact, in this sense, the achievement of a fully EMI shielding enclosure could require the specific holes combined with the components disclosed herein to form a complete system that maintains electrical conductivity.

Figure 13:
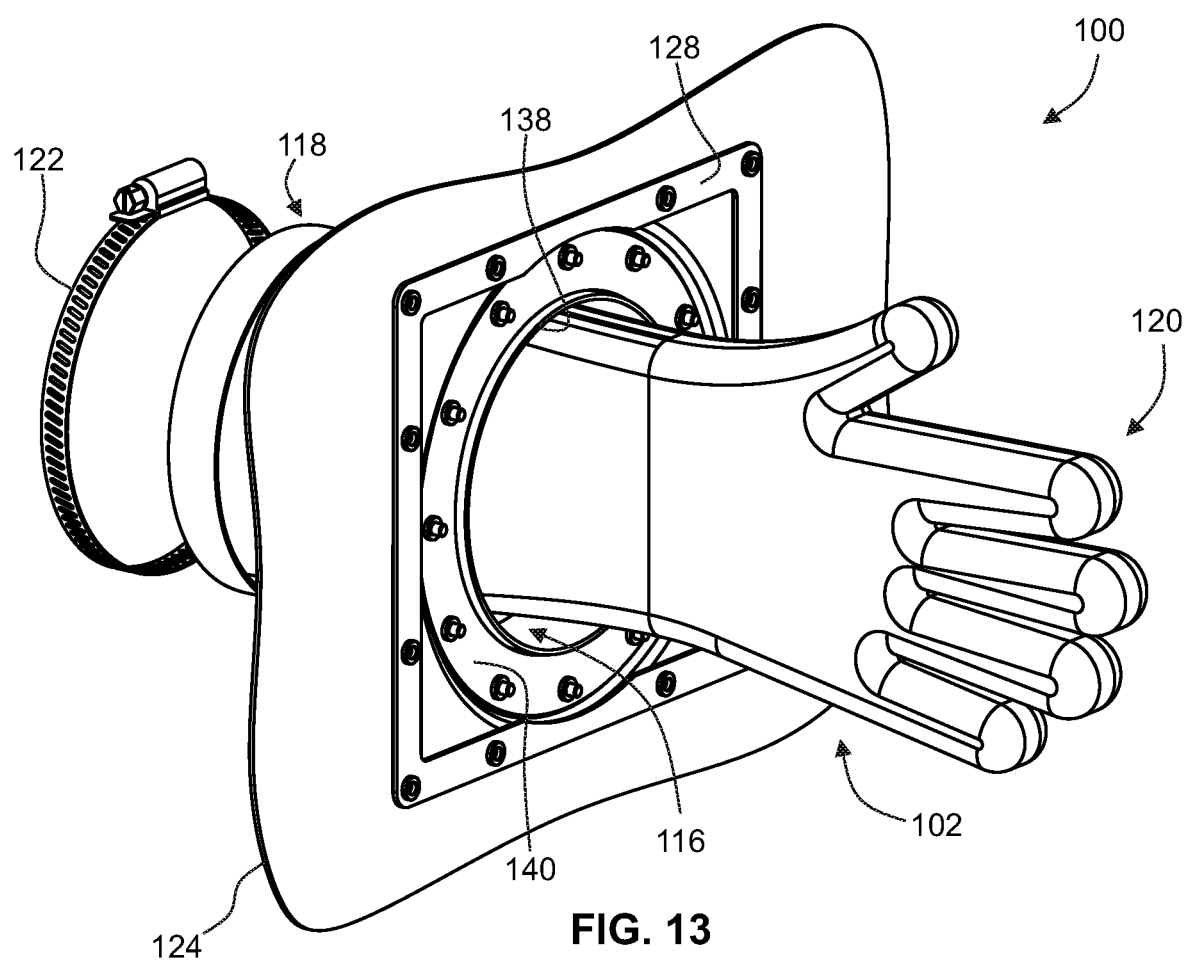
FIG. 13 is a diagrammatic perspective view illustrating how a glove element may be placed into and out of clamped securement with the cylindrical flange member by way of an example actuatable glove securement element.

Referring to FIGS. 11-13, in particular preferred embodiments, the front plate can be fitted against the wall with the tube protruding through the hole in the conductive fabric, and with the holes in the front plate lined up with the holes pre-stamped in the wall and fabric layers. Then, the rectangular backing plate could be pushed against the conductive fabric on the inside of the enclosure, while Allen bolts or screws can be inserted from the front of the front plate, through the wall material(s), through the fabric, and into the rectangular backing plate. When the screws are tightened, the rectangular backing plate can tightly sandwich all materials in between and hold the glove assembly to the enclosure while electrically-conductively sealing the holes created for the Allen screws in the rectangular backing ring area.

Details Regarding Connecting the Shielding Layer to the Glove Interface

Referring the FIGS. 6 and 12, in certain preferred embodiments, the rectangular backing ring (e.g., primary backing element 128) is installed to connect the front panel (e.g., wall securement portion 114 of glove interface element 108) to the enclosure wall 104, but conductivity between the shielding layer 124 (e.g., shielding fabric) of the shielded enclosure and the glove assembly has not yet been achieved. In such case, the next step would be to connect the shielding fabric to the front panel. The round backing ring (e.g., secondary backing element 140) can be inserted into the main cavity 126 of the enclosure 106 and then positioned over the part of the tube 110 which protrudes slightly into the enclosure. This may explain the reason for the previously-described positioning and welding of the tube within the front plate (protruding on both sides, the front side as a mounting area for the gloves, the backside as a guide for the round backing ring when placed inside of the enclosure and on the tube). When the round backing ring is pushed against the fabric, it can tightly sandwich just the conductive fabric layer(s) (which may individually or collectively be considered part of the shielding layer 124) against the front panel, and fasteners 170 such as Allen screws can be installed from the outside to tighten the connection. Through a tight connection, the round backing ring can conductively seal the holes underneath it, while conductively joining the shielding fabric of the enclosure to the material in the front panel/ glove assembly. After this connection is properly complete, the only area of EMI leakage should be the inner part of the tube, whereupon the conductive glove will be installed.

Details Regarding Connecting the Glove Element to the Cylindrical Flange

Figure 15:
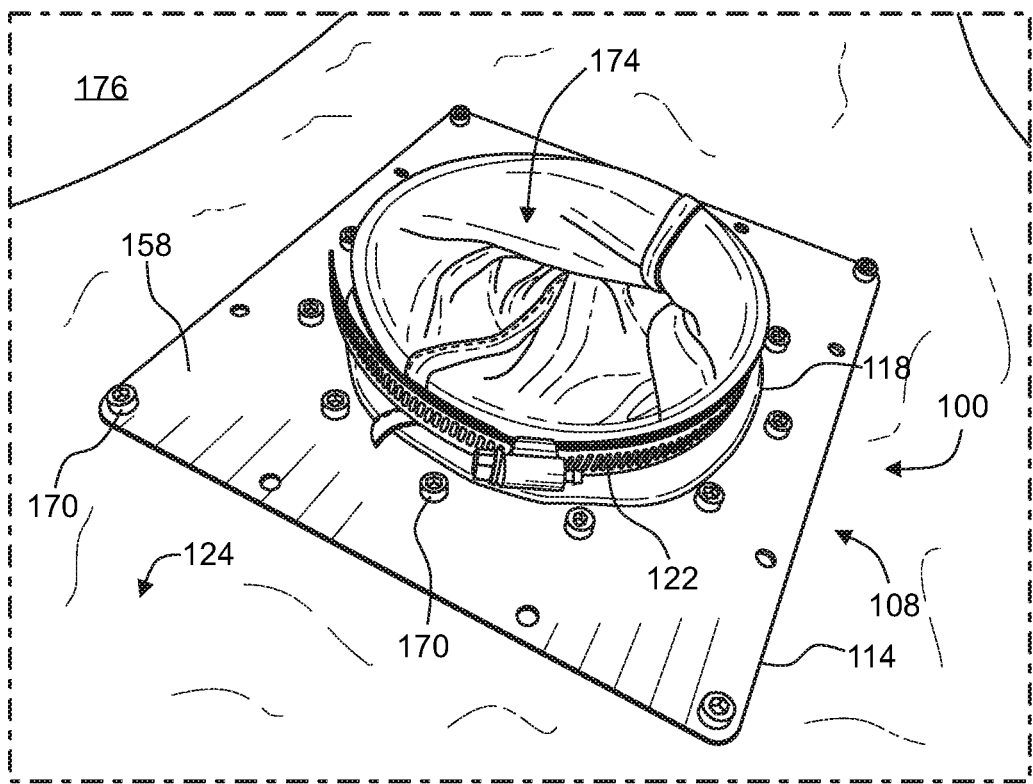
FIG. 15 is a diagrammatic perspective view of a portion of one example glove assembly from outside of the main cavity of a radio frequency shield enclosure.
Figure 16:
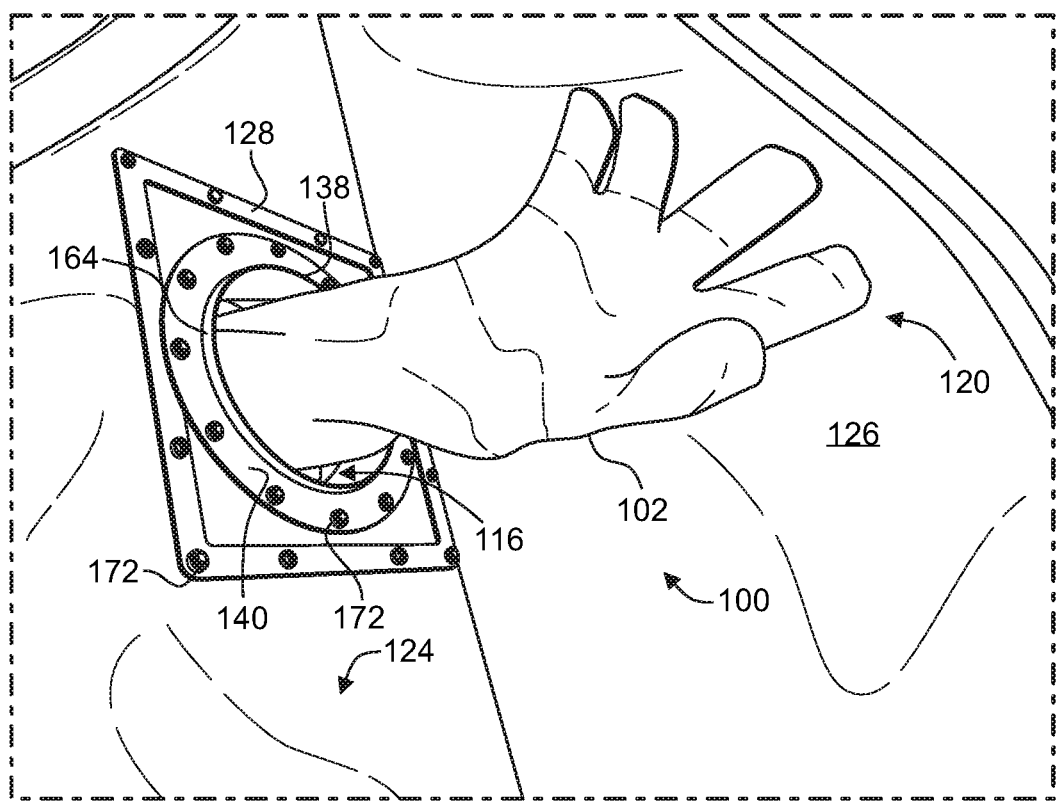
FIG. 16 is a diagrammatic perspective view of a portion of one example glove assembly from inside the main cavity of a radio frequency shield enclosure.

Referring to FIGS. 2, 6 and 15, in particular preferred embodiments, the conductive glove element 102 can be attached to the tube (e.g., cylindrical flange member 110) on the front part of the front panel 114. The protrusion of the tube on the front side (e.g., segment 162) could be just enough to offer enough surface area to wrap the glove around its outer portion and secure it. The glove could wrap around, then a means of securing the glove to the tube, such as a hose clamp, could be introduced. Once the glove is tightly connected to the tube, no areas of EMI leakage should exist and full conductivity could be maintained from the glove, to the glove interface element 108, to the shielding layer 124 of the enclosure 106.

Referring to FIG. 13, when the gloves 102 wear out and become damaged, the user may not need to enter the main cavity 126 of the enclosure 106 to replace them. Rather, the user may instead simply remove the glove securement element 122 (e.g., hose clamp), remove the glove, and replace it with a new one. For cases in which the main cavity of the enclosure becomes impeded, the solutions discussed herein provide an additional advantage. To access the main cavity of the enclosure and remove an impediment, the user may simply remove the glove 102 from the glove interface element 108 and reach inside the main cavity 126. The glove assembly, therefore, may provide an "access portal" to the main cavity of the enclosure. For example, if a light that lights the enclosure needs to be replaced, or a power adapter moved, this access point may become very useful.

With this in mind, alternate embodiments of the glove assemblies and shield enclosures disclosed herein may substitute the glove for a cover component to be similarly secured over the tube 110 in order to seal the enclosure 106 from EMI in the ambient environment 176. When the cover is removed, the glove assembly may actually function solely as an access point to the inner portion of the enclosure. In this sense, particular embodiments of the presently-disclosed glove assembly may not necessarily serve the purpose of attaching gloves to the enclosure at all, but only to act as an access portal.

Example Shielded Enclosure for Use with the Glove Assembly

Figure 14:
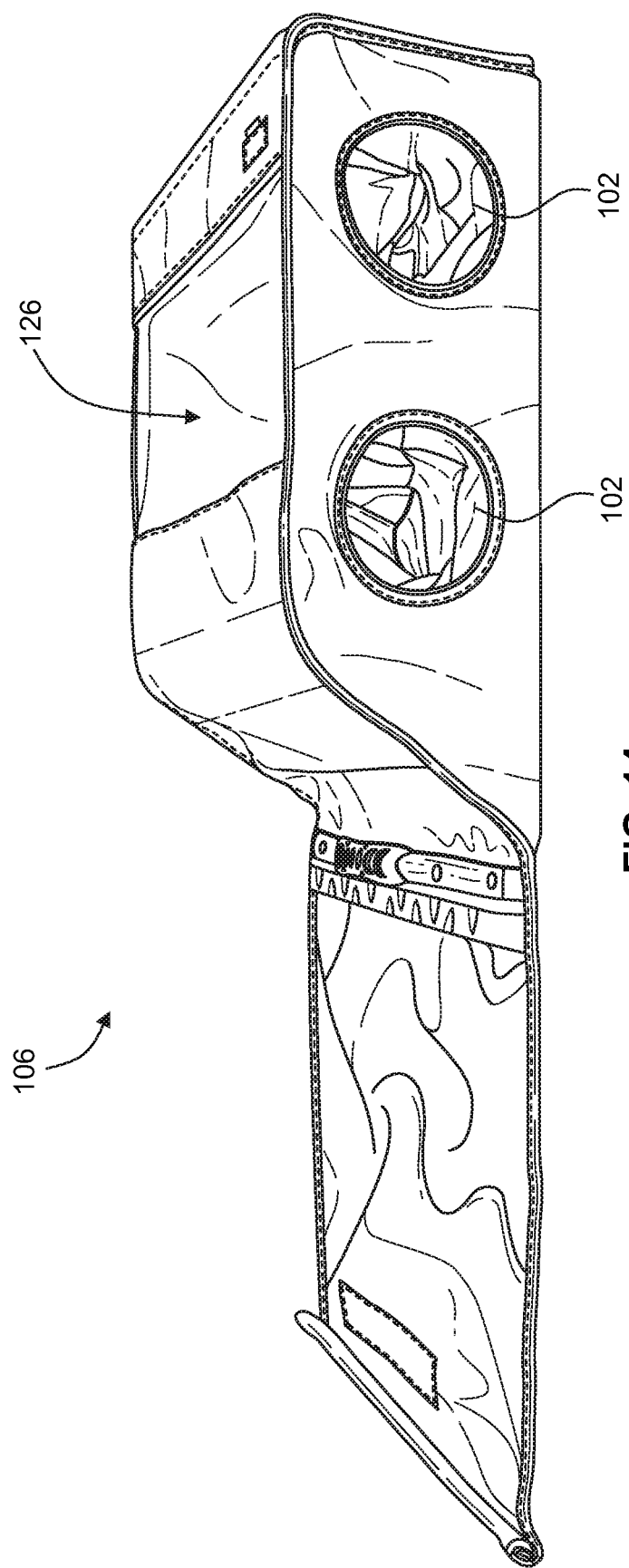
FIG. 14 is a diagrammatic perspective view of an example radio frequency shielded enclosure within which electrically-conductive gloves may be mounted by way of an embodiment of the presently-disclosed glove assembly.

FIG. 14 illustrates a shielded enclosure 106 which may use semi-soft walls, similar to those described herein. The conventional version of this enclosure does not allow unimpeded access to the main cavity, but instead employs a long opening, shown on the left part of the image. It could be difficult for a user to reach inside of the main cavity of the conventional enclosure, demonstrating the need for the presently-disclosed glove assembly on the front, outside portion of the front panel. The conventional version of this example enclosure includes conductive gloves which are sewn to the conductive fabric, then sewn to the outer ballistic nylon layer and then covered with binding. This conventional manufacturing process can be very tedious, require a certain level of strength to manipulate the enclosure under a sewing machine, and can be fraught with error. Furthermore, if the gloves were to become damaged, the expensive enclosure may become worthless.

If the example enclosure were instead to be produced with the presently-disclosed glove assembly in mind, the manufacturer might only need to stamp holes in the wall material(s) and the shielding fabric material(s). The manufacturer could then install the glove assembly, or simply provide the shielded enclosure to another party who may be more suited to the task of hardware installation. If the installation were to include an error, the installer could likely fix the issue and still make use of the enclosure. Contrastingly, if gloves sewn into the conventional enclosure were to have a defect after manufacturing, there may be no feasible way to fix the issue, rendering the enclosure worthless.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A glove assembly for coupling an electrically-conductive glove to an enclosure wall of a radio frequency shielded enclosure, the glove assembly comprising:
   a glove interface element having a cylindrical flange member extending along a port axis, a wall securement portion extending laterally of the port axis, and a glove port extending through the cylindrical flange member along the port axis, the glove interface element being configured to be in affixed engagement with the enclosure wall;
   a glove element comprising electrically-conductive material and having an open end and a closed end; and
   a glove securement element configured to clampingly secure the open end and the cylindrical flange member in RF-signal-sealed engagement with one another;
   wherein when the glove interface element is in the affixed engagement with the enclosure wall and the open end is in the clamping securement with the cylindrical flange member, the glove element is in electrically-conductive communication with the shielded enclosure by way of the glove interface element.

2. A glove assembly as defined in claim 1 wherein the glove securement element is actuatable to enable a user to selectively cause and release the clamped securement.

3. A glove assembly as defined in claim 1 wherein the enclosure wall is comprised of electrically-conductive material, and the affixed engagement places the glove interface element in electrically-conductive communication with the enclosure wall.

4. A glove assembly as defined in claim 1 wherein
   (a) the enclosure wall is comprised of a rigid polymer,
   (b) the shielded enclosure includes a shielding layer disposed between the enclosure wall and a main cavity of the shielded enclosure, and
   (c) the glove interface element is configured to be in electrically-conductive communication with the shielding layer when the glove interface element and enclosure wall are in the affixed engagement with one another.

5. A glove assembly as defined in claim 1 further comprising a primary backing element, wherein the affixed engagement is by way of fastening a portion of the enclosure wall between the wall securement portion and the primary backing element.

6. A glove assembly as defined in claim 1 wherein the wall securement portion includes opposing faces, and the cylindrical flange member extends from each opposing face.

7. A glove assembly for coupling an electrically-conductive glove to an enclosure wall of a radio frequency shielded enclosure, the glove assembly comprising:

a glove interface element having a cylindrical flange member extending along a port axis, a wall securement portion extending laterally of the port axis, and a glove port extending through the cylindrical flange member along the port axis, the glove interface element being in affixed engagement with the enclosure wall;

a glove element comprising electrically-conductive material and having an open end and a closed end; and a glove securement element for clampingly securing the open end and the cylindrical flange member in RF-signal-sealed engagement with one another;

wherein the glove element is in electrically-conductive communication with the shielded enclosure by way of the glove interface element.

8. A glove assembly as defined in claim 7 wherein the glove securement element is actuatable to enable a user to selectively cause and release the clamped securement.

9. A glove assembly as defined in claim 8 wherein
(a) the glove element extends through the cylindrical flange member and into a main cavity of the shielded enclosure, and
(b) the open end extends outward of the cylindrical flange member and folds over an outboard end of the cylindrical flange member.

10. A glove assembly as defined in claim 7 wherein
(a) the shielded enclosure includes a shielding layer disposed between the enclosure wall and a main cavity of the shielded enclosure, and
(b) the glove interface element is in electrically-conductive communication with the shielding layer.

11. A glove assembly as defined in claim 10 further comprising
a primary backing element; and
a secondary backing element;
wherein
(a) the shielding layer includes a shielding periphery portion defined about a shielding aperture,
(b) the enclosure wall includes a wall aperture lip defined about a wall aperture,
(c) the glove port, wall aperture and shielding aperture are in alignment with one another along the port axis,
(d) a section of the enclosure wall is fastened between the wall securement portion and the primary backing element, thereby facilitating the affixed engagement, and
(e) radially inward of the wall aperture lip, the shielding periphery portion is fastened between the secondary backing element and the wall securement portion, thereby maintaining the shielding periphery portion in electrically-conductive communication with the glove interface element.

12. A glove assembly as defined in claim 11 wherein the shielding layer is partially disposed between the enclosure wall and the primary backing element.

13. A glove assembly as defined in claim 11 wherein
(a) the glove port has a port diameter,
(b) the shielding aperture has a shielding aperture diameter, and
(c) the wall aperture has a wall aperture diameter greater than each of the port diameter and the shielding aperture diameter.

14. A glove assembly as defined in claim 11 wherein
(a) the wall securement portion has an obverse face and a reverse face,
(b) the cylindrical flange member has a first segment extending outward of the obverse face, and a second segment extending outward of the reverse face,
(c) an annular conduction channel is defined between the wall aperture lip, the second segment and the wall securement portion, and
(d) the shielding periphery portion is disposed within the annular conduction channel.

15. A glove assembly as defined in claim 14 wherein the secondary backing element is disposed within the annular conduction channel.

16. A glove assembly as defined in claim 11 wherein the secondary backing element is annular.

17. A glove assembly as defined in claim 16 wherein the primary backing element is rectangular.

18. A glove assembly as defined in claim 17 wherein the primary backing element includes a pair of clearance reliefs configured to facilitate passing of the secondary backing element through the primary backing element.

19. A glove assembly as defined in claim 11 wherein the primary backing element and secondary backing element are secured to the wall securement portion by way of a respective plurality of fastener elements.

20. A radio frequency shielded enclosure with an electrically-conductive glove assembly, the shielded enclosure comprising:

an enclosure wall at least partially defining a main cavity within the shielded enclosure;

a shielding layer disposed between the enclosure wall and the main cavity;

a glove interface element having a cylindrical flange member extending along a port axis, a wall securement portion extending laterally of the port axis, and a glove port extending through the cylindrical flange member along the port axis, the glove interface element being in affixed engagement with the enclosure wall and being in electrically-conductive communication with the shielding layer;

a glove element comprising electrically-conductive material and having an open end and a closed end, the glove element extending through the cylindrical flange member and into the main cavity, the open end extending outward of the cylindrical flange member and folding over an outboard end of the cylindrical flange member;

a glove securement element clampingly securing the open end and the cylindrical flange member in RF-signal-sealed engagement with one another;

wherein the glove element is in electrically-conductive communication with the shielded enclosure by way of the glove interface element.

21. A radio frequency shielded enclosure as defined in claim 20 wherein the glove securement element is actuatable to enable a user to selectively cause and release the clamped securement.

22. A radio frequency shielded enclosure as defined in claim 20 further comprising
a primary backing element; and
a secondary backing element;
wherein
(a) the shielding layer includes a shielding periphery portion defined about a shielding aperture,
(b) the enclosure wall includes a wall aperture lip defined about a wall aperture,
(c) the glove port, wall aperture and shielding aperture are in alignment with one another along the port axis,
(d) a section of the enclosure wall is fastened between the wall securement portion and the primary backing element, thereby facilitating the affixed engagement,
(e) radially inward of the wall aperture lip, the shielding periphery portion is fastened between the secondary backing element and the wall securement portion, thereby maintaining the shielding periphery portion in electrically-conductive communication with the glove interface element, and (f) the shielding layer is partially disposed between the enclosure wall and the primary backing element.

23. A radio frequency shielded enclosure as defined in claim 22 wherein (a) the wall securement portion has an obverse face and a reverse face, (b) the cylindrical flange member has a first segment extending outward of the obverse face, and a second segment extending outward of the reverse face, (c) an annular conduction channel is defined between the wall aperture lip, the second segment and the wall securement portion, and (d) the shielding periphery portion is disposed within the annular conduction channel.

24. A radio frequency shielded enclosure as defined in claim 23 wherein the secondary backing element is disposed within the annular conduction channel.

25. A radio frequency shielded enclosure as defined in claim 24 wherein the primary backing element is rectangular and includes a pair of clearance reliefs configured to facilitate passing of the secondary backing element through the primary backing element.

26. A radio frequency shielded enclosure as defined in claim 22 wherein the primary backing element and secondary backing element are secured to the wall securement portion by way of a respective plurality of fastener elements.

* * * * *